(12) United States Patent
Bockelkamp (10) Patent No.: US 10,331,833 B2
(45) Date of Patent: Jun. 25, 2019

(54) OPTIMIZED GENERATION OF OVERALL NETLIST AND BIT STREAM

(71) Applicant: dSPACE digital signal processing and control engineering GmbH, Paderborn (DE)

(72) Inventor: Matthias Bockelkamp, Paderborn (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 0 days.

(21) Appl. No.: 15/585,351

(22) Filed: May 3, 2017

(65) Prior Publication Data

US 2017/0323031 A1 Nov. 9, 2017

(30) Foreign Application Priority Data

May 3, 2016 (EP) .................................... 16168055
Nov. 11, 2016 (DE) ........................ 10 2016 120 934

(51) Int. Cl.
*G06F 17/50* (2006.01)

(52) U.S. Cl.
CPC ........ *G06F 17/505* (2013.01); *G06F 17/5054* (2013.01); *G06F 17/5077* (2013.01)

(58) Field of Classification Search
CPC ......... H04L 43/50; H04L 43/04; H04L 1/243; H04L 2027/0036; H04L 41/145;
(Continued)

(56) References Cited

U.S. PATENT DOCUMENTS 6,535,016 B2   3/2003  Choukalos et al.
7,337,100 B1   2/2008  Hutton et al.
(Continued)

FOREIGN PATENT DOCUMENTS

DE   102013104320 A1   10/2014
EP       0905906 A2    3/1999
(Continued)

OTHER PUBLICATIONS

EP, Extended European search report, Application No./Patent No. 16168055.8, dated Sep. 6, 2016.
(Continued)

*Primary Examiner* — Binh C Tat
(74) *Attorney, Agent, or Firm* — Orrick, Herrington & Sutcliffe LLP; Joseph Calvaruso; Richard Martinelli (57) ABSTRACT

The present disclosure relates to a method for generating an overall netlist (50) comprising the following steps: providing a first PLD code (24) as first netlist (26), wherein the first PLD code (24) has at least one first functional block (28), providing a second PLD code (30), wherein the second PLD code (30) has at least one second functional block (32) for alternative use instead of a corresponding first functional block (28), providing a switch PLD code (40) having at least one switch (42) assigned to the at least one first functional block (28) for connecting the first functional block (28) assigned to the switch (42), connecting the at least one second functional block (32) to one switch from the at least one switch (42) as an alternative to the corresponding first functional block (28), implementing at least one switch driving signal (44) for the at least one second functional block (32), wherein the at least one switch driving signal (44) is assigned to the corresponding switch (42) for connecting the at least one second functional block (32), creating the overall netlist (50) from the first PLD code (24), the
(Continued)

second PLD code (30) and the switch PLD code (40), and removing from the overall netlist (50) functional first blocks (28) which are not utilized on the basis of the switch driving signal (44) of the corresponding switch (42).

18 Claims, 10 Drawing Sheets

(58) Field of Classification Search
CPC ......... H04L 43/10; G06F 21/76; G06F 17/00; G06F 17/30477; G06F 2003/0692; G06F 21/602; G06F 21/72; G06F 21/85; G06F 3/0601; G06F 3/061; G06F 13/16; G06F 13/4068; G06F 13/4265; G06F 17/5054; G06F 17/505; G06F 16/2455; G06F 3/0655; G06F 3/067; G06F 3/0683; G06F 9/44505; G06F 9/4881; G06F 17/5077; G06F 2217/06; G06F 17/5045; G06F 17/5072; G06F 9/4401; G06F 9/4494; G06F 16/90339; G06F 16/90344; G06F 17/5009; G06F 17/504; G06F 2217/10; G06F 2217/14; G06F 2217/62; G06F 2217/72; G06F 2217/84; G16B 50/00; H03K 19/17736; H01L 27/0207; H01L 27/11807; H01L 21/76886; H01L 23/528
USPC .................................................. 716/100–107
See application file for complete search history.

(56) References Cited

U.S. PATENT DOCUMENTS

| | | | |
|---|---|---|---|
| 8,407,645 B1 | 3/2013 | Caranci et al. | |
| 8,635,571 B1* | 1/2014 | Goldman | G06F 17/5054 716/116 |
| 2008/0059931 A1* | 3/2008 | Peters | G06F 17/5072 716/122 |
| 2014/0189622 A1* | 7/2014 | Titley | G06F 17/5054 716/105 |

FOREIGN PATENT DOCUMENTS

| | | |
|---|---|---|
| EP | 2945083 A1 | 11/2015 |
| WO | WO 0141309 A1 | 6/2001 |

OTHER PUBLICATIONS

On the Optimization of FPGA Area Depending on Target Applications. Z. Marrakchi, H. Parvez, A. Klic, H. Mehrez and H. Marrakchi. 2010 IEEE Asia Pacific Conference on Circuits and Systems (APCCAS). Dec. 6-9, 2010, pp. 308-311.
GOAHEAD: A Partial Reconfiguration Framework. C. Beckhoff, D. Koch and J. Torrensen. 2012 IEEE 20th Annual International Symposium on Field-Programmable Custom Computing Machines (FCCM). Apr. 29, 2012 to May 1, 2012, pp. 37-44.
Vivado Design Suite User Guide—Design Flows Overview. UG892 (v2016.1), Xilinx, Apr. 6, 2016.

\* cited by examiner

(Prior art)

OPTIMIZED GENERATION OF OVERALL NETLIST AND BIT STREAM

CROSS REFERENCE TO RELATED APPLICATIONS

This application claims the benefit of European patent application no. EP16168055.8, filed on May 3, 2016; and German patent application no. DE102016120934.1, filed on Nov. 11, 2016. The entire contents of all are hereby incorporated by reference in its entirety.

FIELD OF THE INVENTION

The present invention relates to a method for generating an overall netlist, and to a method for generating a bit stream from the overall netlist. Furthermore, the invention relates to a programmable data processing device for carrying out the above method, a computer program product comprising computer-implemented instructions which, after loading and execution in a suitable data processing device, performs the above method, and a digital storage medium comprising electronically readable control signals which can interact with a programmable data processing device such that the above method is performed on the data processing device.

BACKGROUND OF THE INVENTION

The real-time simulation of complex, dynamic models places high demands even on modern computation nodes on account of the tight temporal boundary conditions. By way of example, such models are employed in automotive hardware-in-the-loop simulations (HIL) and in the field of automotive rapid control prototyping (RCP), where fast control loops have to be closed. In the case, too, of controlled systems having a high dynamic range, such as in the case of electric motors, for example, short cycle times and low latencies are indispensible. These are now virtually impossible to implement solely with CPU-based simulations that run on a CPU of a computation node (CN). On the basis of CPU-based processing in a computation node the term CN is also used generally for the CPU.

A programmable logic circuit, often designated as programmable logic device or PLD for short in the specialist literature is an electronic component for integrated circuits. In contrast to logic gates having a prescribed fixed function, PLDs obtain their function only after manufacture by means of the corresponding programming (configuration). Simple programmable logic circuits usually consist of an array of AND logic combinations followed by an array of OR logic combinations. They include for example programmable read-only memory (PROM), programmable array logic (PAL) or generic array logic (GAL), and programmable logic arrays (PLA). In the case of a PLA, both the AND array and the OR array are programmable. The complex programmable logic device (CPLD) and field programmable gate array (FPGA) are known as programmable logic circuits of higher complexity. CPLDs such as FPGAs often offer programmable I/O cells which allow various signal interfaces to be connected.

Accordingly, for example PLDs, in particular FPGAs, can provide support as additional hardware components in real-time simulation by virtue of their performing the calculation of dynamic parts of a model. As a result of the high flexibility and possibility of parallel processing of signals, even hard real-time requirements can easily be fulfilled by the use of PLDs, in particular FPGAs. The PLDs can generally serve as hardware accelerators for supporting CPUs.

There are two basic possibilities for the use of the PLD, in particular an FPGA. In a first operating mode (manufacturer mode), a fixed functionality is loaded onto the PLD, in particular an FPGA, as a result of which the PLD, in particular an FPGA, is configured. Said fixed functionality is usually provided by a manufacturer of a corresponding system and is designated hereinafter as first PLD code. By way of example, I/O channels having a fixed functional scope are provided by means of said fixed functionality, such that the I/O channels can be used in an application in the CN. An application on the processor of the CN can access the fixed PLD functionality and the I/O channels.

Figure 1:
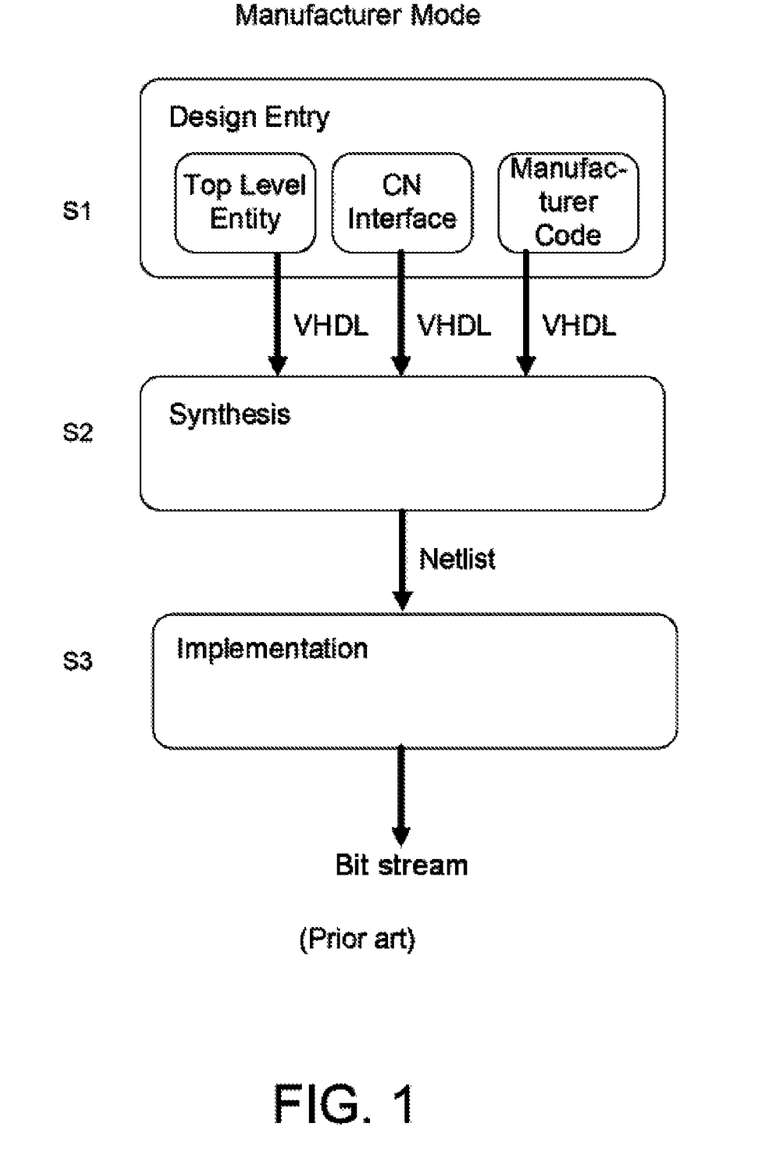
FIG. 1 shows a flow diagram of a method known per se for generating an overall netlist and a bit stream from a manufacturer PLD code according to the prior art.

A method for generating an overall netlist in the manufacturer mode is illustrated in a simplified manner by way of example in FIG. 1. Accordingly, in a first step S1, designated here as "design entry", a PLD code, designated here as "manufacturer code", is created, which contains provided functionality. An interface logic for communication with the CN is additionally provided. The PLD code and the interface logic can also be created as one code block. In a second step S2, designated here as synthesis, an overall netlist is generated from said PLD code. In a further, third step S3, implementation, comprising the steps of placing and routing, a bit stream for use in the FPGA is generated, inter alia, from said overall netlist. The entire method can be carried out by a system manufacturer for example; the user then obtains only the bit stream for use in the FPGA.

Figure 2:
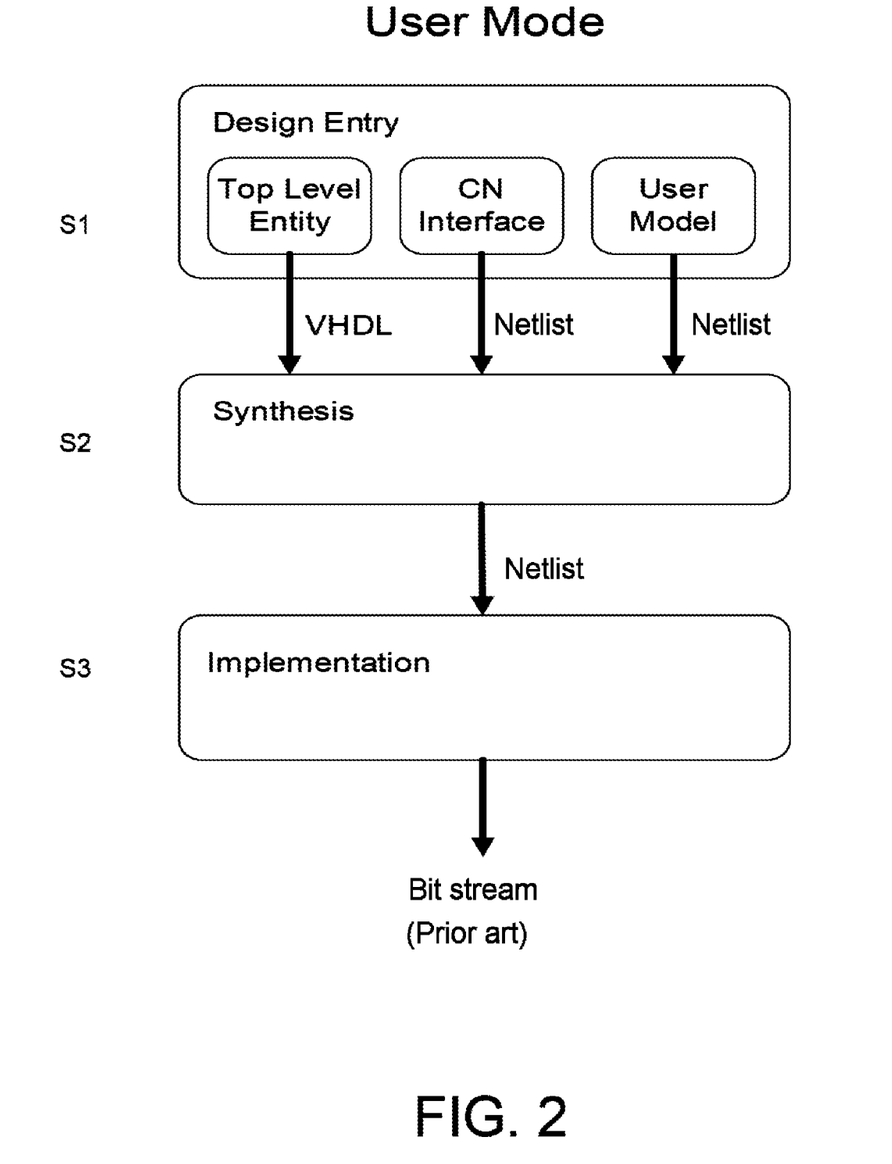
FIG. 2 shows a flow diagram of another method known per se for generating an overall netlist and a bit stream from a user PLD code according to the prior art.

In a second operating mode (user mode), which is likewise illustrated in a simplified manner by way of example in FIG. 2, in a first step S1, designated here once again as "design entry", a model is created which contains functionality provided by the user. This PLD code is designated hereinafter as second FPGA code or generally as second PLD code. In a second step S2, designated here as synthesis, with the incorporation of the interface logic, an overall netlist is generated from said model. In a further, third step S3, implementation, a bit stream for use in the FPGA is generated, inter alia, from said overall netlist. The second PLD code, which is thus created in a model-based manner by the user and uses for example the I/O channels in the FPGA, can then be loaded onto the FPGA. The PLD code may be for example a control model on the FPGA or a preprocessing of the I/O channels in the FPGA. This method is advantageous, for example, if the interface logic is provided by the apparatus manufacturer. In that case the user need only create the model and carry out the rest of the method. By contrast, the user need not be concerned with the linking of the FPGA interfaces.

In this context, a particularly advantageous method for connecting I/O channels that are not explicitly used is known for example from DE 10 2013 104 320 A1.

Figure 3:
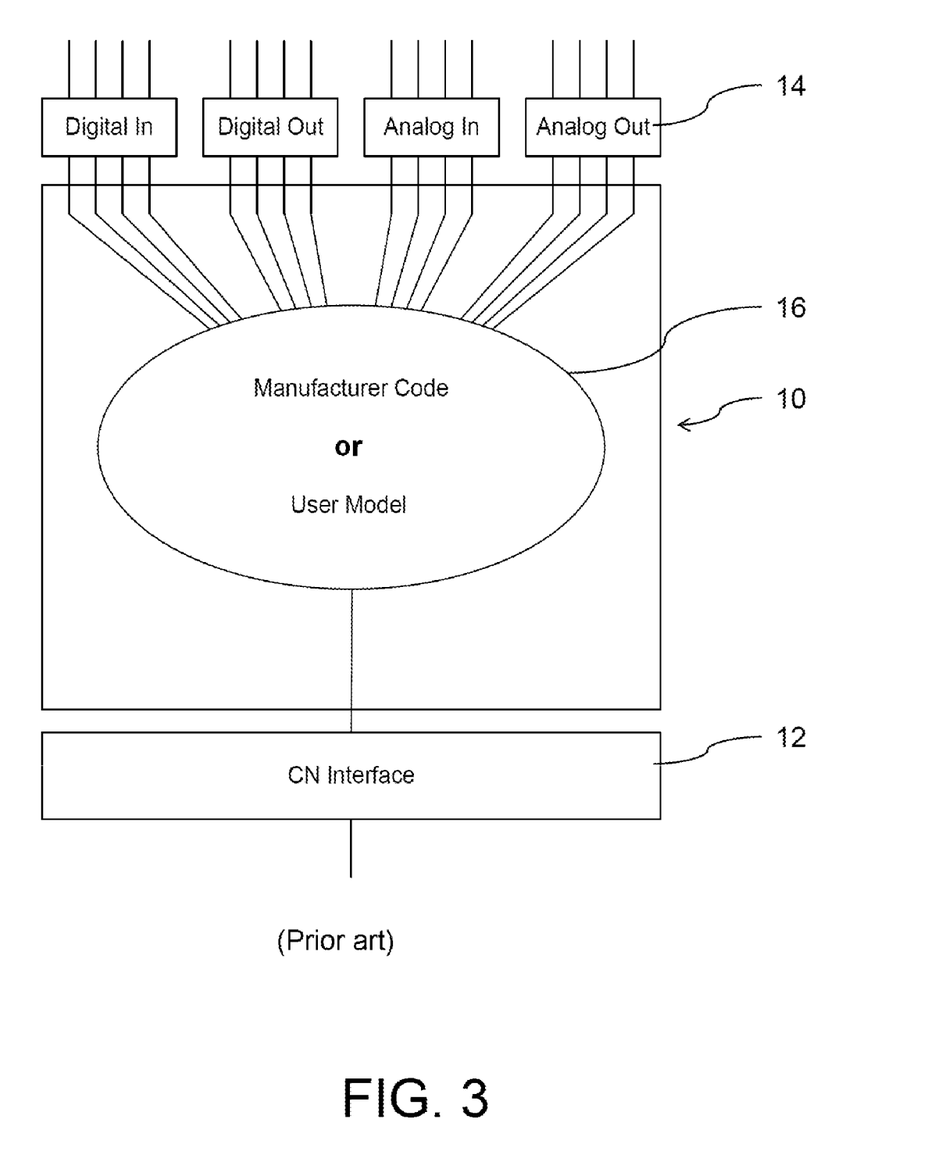
FIG. 3 shows a further illustration of an FPGA as PLD with a logic on the basis of manufacturer PLD code or user PLD code in accordance with the prior art methods depicted in FIGS. 1 and 2.

A further illustration of the first two methods is shown in FIG. 3. Accordingly, a CN interface 12 to a computation node is provided on an FPGA 10. In addition, in the first operating mode the manufacturer code 16 and in the second operating mode the user model 16 are located on the FPGA. Data exchange between the manufacturer code 16 or user model 16 and the computation node is possible via the CN interface 12. The FPGA can receive and/or output data via I/O channels 14. Received data can be processed by the manufacturer code 16 or user model 16 and be forwarded to the computation node via the CN interface 12.

A combination of manufacturer code and user code by the incorporation of code which is presynthesized by of the manufacturer and which is typically provided as a netlist has the advantage that this PLD code is already "finished" and can easily be incorporated by the user. What is disadvantageous about that is that the code on the part of the manufacturer then always occupies the entire space in the FPGA to provide a corresponding default functionality. Accordingly, a reduced space is available on the FPGA for PLD code of the user. A use of a larger FPGA is associated with correspondingly higher costs, and is therefore usually ruled out for this reason. As a result, reserves for later extensions or bug fixes are already used up at the beginning. Furthermore, it should be taken into consideration that compile times increase more than proportionally when the FPGA has a high occupancy level, i.e. with increasing occupancy of the FPGA, such that a corresponding utilization of the FPGA should be avoided in practice. This holds true all the more in the case of applications in the RCP environment which experience frequent changes.

One method known per se for incorporating only that part of the first PLD code which is actually utilized consists e.g. in the utilization of "generate" instructions. However, the latter do not function with presynthesized code, i.e. if the first PLD code is provided by the manufacturer typically as a netlist. However, providing the first code as a first netlist is important in order that build times for the overall netlist made from the first and second PLD codes are kept short. Depending on the functionality, build times of several hours just for the first PLD code on the part of the manufacturer are entirely possible. It is thus necessary to take a decision as to whether presynthesized code, i.e. typically the first netlist, will be utilized to shorten the creation of the overall netlist, or whether the first PLD code can be fixedly shortened in order to have more capacities available for the user model, in which case the build times are correspondingly lengthened considerably.

SUMMARY OF THE INVENTION

The present disclosure is thus based on the object of specifying a method of the type mentioned above which enables a high flexibility in the simultaneous use of PLD code of the system manufacturer and of a user in conjunction with short build times. A further object consists in providing a programmable data processing device, a computer program product comprising computer-implemented instructions, and a digital storage medium, for achieving the stated objects.

Accordingly, the object is achieved by a method for generating an overall netlist comprising the following steps: providing a first PLD code as first netlist, wherein the first PLD code has at least one first functional block, providing a second PLD code, wherein the second PLD code has at least one second functional block for alternative use instead of a corresponding first functional block, providing a switch PLD code having at least one switch assigned to the at least one first functional block for connecting the first functional block assigned to the switch, connecting the at least one second functional block to one switch from the at least one switch as an alternative to the corresponding first functional block, implementing at least one constant switch driving signal for the at least one second functional block, wherein the at least one switch driving signal is assigned to the corresponding switch for connecting the at least one second functional block, creating the overall netlist from the first PLD code, the second PLD code and the switch PLD code, and removing from the overall netlist functional first blocks and switches which are not utilized on the basis of the constant switch driving signal of the corresponding switch at the execution time.

The present disclosure also specifies a method for generating a bit stream, comprising the following steps: generating an overall netlist according to the above method, generating a placed netlist from the overall netlist, generating a routed netlist from the placed netlist, and converting the routed netlist into a bit stream.

The present disclosure additionally specifies a programmable data processing device for carrying out one or both of the above methods.

The present disclosure furthermore specifies a computer program product comprising computer-implemented instructions which, after loading and execution in a suitable data processing device, performs one or both of the above methods.

The present disclosure furthermore specifies a digital storage medium comprising electronically readable control signals which can interact with a programmable data processing device such that one or both of the above methods is or are performed on the data processing device.

A basic concept of the present disclosure, therefore, is that of providing PLD code having at least one switch in order to enable an alternative use of first functional blocks and/or second functional blocks via the switch. Although this requires additionally providing the switches in the switch PLD code, this additional outlay is incurred only before the overall netlist is created. An optimization of the overall netlist can be effected on the basis of the alternative use of the first and second functional blocks. In this regard, the switches which will not switch on the basis of the constant switch driving signal at the execution time can be removed. The additionally inserted switches thus take up no space in the overall netlist. Functional first blocks which are not utilized on the basis of the constant switch driving signal of the corresponding switch can likewise be removed, which generally leads to an increase in the availability of the PLD for PLD code of the user, i.e. for the second PLD code. Consequently, the advantages of the use of manufacturer-specific code, which is typically provided as a netlist, can be combined with the advantages of little tying up of resources of the PLD by virtue of the fact that only that part of the first PLD code, here of the PLD code of the manufacturer, which can actually be utilized by the user is loaded onto the PLD. Consequently, dedicated functions can be implemented as necessary by corresponding second functional blocks being provided in the second PLD code. Nevertheless, it is possible to provide default functions in the first functional blocks, which can be used in a simple manner by the user as necessary.

By way of example, the first and second functional blocks can comprise code for driving a preprocessing stage of an assigned I/O driving interface. Preferably, in this case, each of the second functional blocks has an interface—identical to the corresponding first functional block and thus suitable—for driving the preprocessing stage of the assigned I/O driving interface in order to be able to perform a driving of the preprocessing stage of the assigned I/O driving interface as an alternative to the corresponding first functional block. Consequently, in this case, the switches, by means of the switch driving signal, can connect the preprocessing stage of the assigned I/O driving interface either to the assigned first functional block or to the assigned second functional block.

The first PLD code concerns for example PLD code that is provided by a manufacturer of a system for use by a user. This involves for example a system for real-time simulation of complex, dynamic models, which system is furthermore employed for example in automotive hardware-in-the-loop simulations (HIL) or in the field of automotive rapid control prototyping (RCP), where fast control loops have to be closed. Another example is controlled systems having a high dynamic range, such as in the case of electric motors, for example, such that short cycle times and low latencies are indispensible.

By implementing the constant switch driving signal, a permanent selection of the corresponding functional block is made in a simple manner. This selection can also be identified automatically when creating the netlist in order, proceeding therefrom, to bring about the alternative use of the corresponding first or second functional block in the overall netlist. A corresponding first functional block which is not usable on account of the switch position can thus easily and automatically be identified in the process of creating the overall netlist and be removed.

A netlist can be represented in a standardized format (EDIF) for providing the logic of a PLD. It is usually the result of a synthesis. The netlist is synthesized from a source code, wherein the source code, in the present case e.g. as text or as a graphical model, can be edited directly in order to achieve changes to the logic of the PLD, but the netlist is not usually edited by the user. This applies in principle to every netlist. Examples of netlists are the first and second netlists defined further below, and the overall netlist. The netlist in principle denotes the netlist without further information. However, there are also special variants of netlists as intermediate steps for generating the bit stream which include additional information.

A placed netlist can be generated from the netlist in a subsequent step, also designated as placing (place). In this case, the logic elements described in the netlist are spatially assigned to actual logic elements of the target FPGA.

The routed netlist is the result of the routing of the placed netlist and additionally contains a definition of actual connecting lines between the actual logic elements of the target PLD.

The routed netlist can then be converted into a bit stream that can be loaded onto the target PLD.

Source code in text form can be provided for example in an HDL format such as Verilog, VHDL or other formats. Graphical source code, also designated as graphical model, is provided for example as a Simulink model, flow diagram, circuit diagram or in other forms.

When creating the overall netlist there are various possibilities for combining the first PLD code, the second PLD code and the switch PLD code. In this regard, the individual PLD codes can in each case be synthesized individually to form a netlist. The netlists thus generated are then incorporated under an overlying top entity. In a further step, the netlists are joined together and all unused functional blocks are removed by optimization. Accordingly, functional first blocks which are not utilized on the basis of the switch information of the corresponding switch can be removed.

Removing from the overall netlist functional first blocks which are not utilized on the basis of the constant switch driving signal of the corresponding switch, usually comprises removing logic elements and signal paths.

The method is generally applicable to arbitrary programmable logic circuits, including a programmable logic device or PLD for short. PLDs are electronic components for integrated circuits which obtain their function only after manufacture by means of corresponding programming (configuration). PLDs encompass programmable read-only memory (PROM), programmable array logic (PAL) or generic array logic (GAL), programmable logic arrays (PLA), complex programmable logic device (CPLD) and field programmable gate array (FPGA). Preferably, the method relates to the programming of an FPGA, such that corresponding first and/or second PLD code is provided and a corresponding overall netlist for an FPGA is created from the PLD code. In this case, first and second PLD codes and also the switch PLD code are first and second FPGA codes and also switch FPGA code.

In one advantageous embodiment according to the invention, the method comprises the additional step of presetting the at least one switch in the switch PLD code for connecting the assigned first functional block. As a result of presetting the switch, by way of example, the switch driving signal is assigned an initial value that is overwritten by each allocation. Such an allocation can be carried out only before the creation of the overall netlist e.g. by the user or by the second PLD code. At the execution time, the switch driving signal can no longer be overwritten. Consequently—with the use of the corresponding first functional block—no additional setting of the corresponding switch is necessary. The presetting of the switch thus has the effect that the corresponding first functional block is preset, that is to say it is not removed by optimization. An incorrectly set switch would otherwise remove the function by optimization. A switch without a set switch position would possibly lead to a termination of the compilation process.

In one advantageous embodiment according to the invention, the step of providing a switch PLD code comprises providing the switch PLD code as part of the first PLD code or as a separate PLD code. By way of example, the switch PLD code can be provided as a separate PLD code for example as source text or as part of the first PLD code as a netlist. Particularly preferably, however, the switch PLD code is already contained in the first PLD code, such that it can be provided together with the latter as first netlist.

In a further advantageous embodiment according to the invention, the step of providing a first PLD code as a first netlist comprises providing the first PLD code as a routed netlist, and the step of providing a switch PLD code comprises providing the switch PLD code as a separate PLD code. Since the first PLD code has already undergone the map, place and route steps and is present as a routed netlist, these steps can be omitted after the process of joining together the first PLD code with the second PLD code and the switch PLD code for the first PLD code. This entails a further timesaving.

The second PLD code is then placed onto the free areas of the FPGA, that is to say areas not occupied by the first PLD code, and is routed. Switches of the switch PLD code which are connected to a constant switch driving signal and will therefore not switch at the execution time do not require any space on the FPGA. Likewise, parts of the first PLD code which are not utilized on account of the constant switch position of the switch PLD code are removed. Unutilized parts of the first PLD code can be identified from the fact that their output values are thus not utilized at the execution time. The output values of an unutilized part end at the unconnected terminal of a switch that is connected to a constant switch driving signal. As a result of this optimization, additional space is available for the second PLD code.

In a further embodiment, the first netlist leaves free a contiguous area of the FPGA resources for the second PLD code. This is achieved by virtue of the first netlist being placed and routed in a closed area of the FPGA. The second PLD code can be placed and routed more easily in a contiguous area. This accelerates the corresponding steps. If the second PLD code requires more FPGA resources than are present in the contiguous free area, it is also possible to use free resources outside the contiguous free area. As a result, even PLD codes that require more FPGA resources than are present in the contiguous free area can be utilized as second PLD codes.

If the second PLD code cannot be placed and routed on the free FPGA resources with the requisite timing requirements, the unplaced netlist of the first PLD code is utilized instead of the routed netlist of the first PLD code. More optimization possibilities when placing and routing the first PLD code and the second PLD code are available as a result. An unplaced netlist can also be obtained from the routed netlist by ignoring or erasing the placing and routing information.

Alternatively, provision may be made for providing, within the netlist of the first PLD code, an area for the second PLD code as an area for partial reconfiguration, a so-called PR region. Only the resources within the PR region can then be utilized for the second PLD code. However, the second PLD code can be exchanged for a third PLD code more easily, possibly even during ongoing operation of the FPGA.

If the second PLD code is present as a netlist, by comparing the FPGA resources required in the netlist with the known FPGA resources within the PR region it is possible to decide, already before placing, whether the resources of the contiguous free area suffice for placing. If the second PLD code is present as source code, the comparison can be carried out after the synthesis of the netlist from the source code. If the resources do not suffice for the second PLD code, the above-described netlist of the first PLD code is utilized without the PR region and the second PLD code is placed into the free areas of the FPGA as described above.

In a further particularly preferred embodiment according to the invention, the step of implementing at least one switch driving signal for the at least one second functional block comprises implementing the at least one switch driving signal in the second PLD code. Accordingly, it is possible to carry out a separation of the provision of the switch as such and the setting of the switch, namely of the switch driving signal. Effective handling of the PLD code is made possible as a result. As a result of the implementation of the switch driving signal in the second PLD code, a user can simply carry out a selection of the first or second functional block to be used. As a result, build times are restricted to a minimum since the switch as part of the first PLD code can be provided with the latter already beforehand as part of the first netlist. Alternatively, it is possible to implement the switch driving signal for the at least one second functional block in the switch PLD code if said switch PLD code is present in the source code rather than as a netlist. In the first netlist, the switch driving signal could no longer be varied as desired by the user in order to select the corresponding first or second functional block. In any case, at the earliest at the time of creating the overall netlist, both the switch and the switch driving signal are present within an entity, such that the switch cannot already be removed beforehand in the course of an optimization. Accordingly, the first PLD code can be presynthesized in any case, without the switch PLD code being removed in the course of an optimization.

In one advantageous embodiment according to the invention, the method comprises the step of connecting I/O channels to the first and/or second functional block. The I/O channels constitute the access to the FPGA via which, for example, measurement and control signals can be transferred to or from the FPGA. The type of processing is implemented in the FPGA itself. In this case, the first functional blocks preferably offer a standard functionality for the processing of the signals provided via or to the I/O channels, which is able to be replaced by the user with the second functional blocks as necessary. As input and/or output of the FPGA, signals can be transferred in a defined manner in both directions. Preferably, a switch is assigned to each of the I/O channels. As a result, each I/O channel can be connected either to the manufacturer code or to the user code. A preprocessing stage, for example an ND converter, a D/A converter, an amplifier or the like, can additionally be arranged at each I/O channel. The preprocessing stage is accordingly preferably arranged between the switch and the respective I/O pin.

In one advantageous embodiment according to the invention, the step of providing a first PLD code as netlist comprises providing the first PLD code as an encrypted netlist. By providing the first PLD code as an encrypted netlist, it is possible for the first PLD code to be protected against undesired inspection or even extraction. Internal information on which the first PLD code is based can thus be protected against undesired access by third parties. The use of an encrypted netlist for generating the overall netlist can take place without restriction. The encryption does not restrict a use for example in a compiler for generating the overall netlist and/or the bit stream. More precisely, a restriction arises only in so far as, for the further processing of the encrypted netlist, it is possible to use only such compilers whose public keys are stored in the encryption program used. Encryption is also understood to mean obfuscation in this context.

In one advantageous embodiment according to the invention, the step of providing a second PLD code comprises providing the second PLD code as source code. The source code should be understood as unprocessed user input as distinguished from the netlist, which constitutes a processed source code. The source code constitutes a description of the functionality of a logic of an entity. The user can thus utilize all afforded possibilities for the definition of the logic.

In one advantageous embodiment according to the invention, the step of providing a second PLD code as source code comprises providing the second PLD code in text form or as a graphical program. The manner of providing the source code is thus possible in practically any desired way. In principle, combinations of source code in text form and as a graphical program are also possible.

In one advantageous embodiment according to the invention, the step of providing a second PLD code comprises providing the second PLD code as a second netlist. The second PLD code can thus be provided without the second netlist firstly having to be created from the second PLD code. An existing netlist can thus be reused in any desired manner after the creation of the overall netlist. This may also concern only part of the second PLD code, if the latter is provided for example partly as a netlist and partly as source code.

In one advantageous embodiment according to the invention, the step of creating the overall netlist from the first PLD code, the second PLD code and the switch PLD code comprises creating a second netlist and a switch netlist and merging the first netlist, the second netlist and the switch netlist. Accordingly, when creating the overall netlist, firstly a respective netlist, i.e. the first netlist, the second netlist or the switch netlist, can be generated firstly from each of the PLD codes, wherein the individual netlists are combined by the merging to form an overall netlist. Preferably, removing functional first blocks which are not utilized on the basis of the switch driving signal of the corresponding switch is also carried out in this case. If the switch PLD code is already part of the first PLD code, creating the overall netlist may also comprise only correspondingly creating a first and respectively second netlist and merging these two netlists. Merging the netlists is preferably carried out during the synthesis of the second netlist. Alternatively, merging the netlists is carried out after the synthesis of the second netlist during implementation.

More extensive details concerning the creation of an overall netlist, for example using a compiler, are known as such to the person skilled in the art. For the sake of completeness, reference is made to "Vivado Design Suite User Guide", downloadable at xilinx.com, which documents this knowledge.

The present disclosure according to the invention is explained in greater detail below on the basis of preferred embodiments with reference to the accompanying drawings.

BRIEF DESCRIPTION OF THE DRAWINGS

In the figures

DETAILED DESCRIPTION OF THE INVENTION

Figure 4:
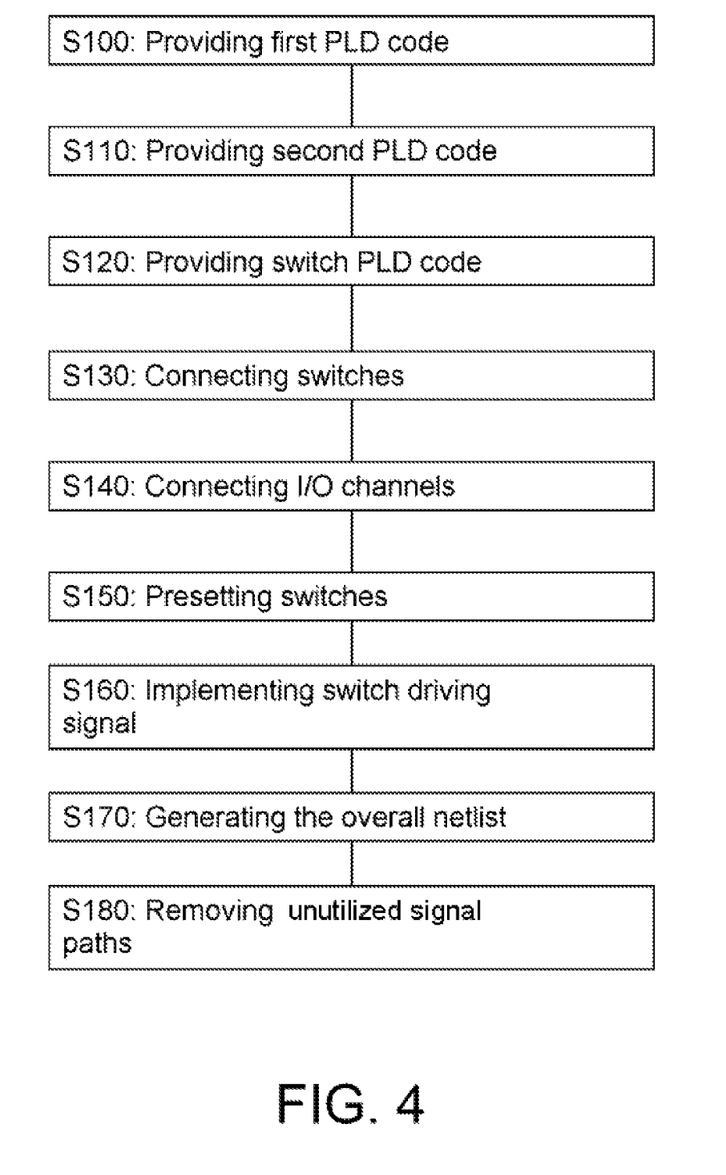
FIG. 4 shows a detailed flow diagram of a method according to the invention for generating an overall netlist on the basis of a mixture of manufacturer PLD code and user PLD code according to a first, preferred embodiment.

FIG. 4 shows a method according to the invention for generating an overall netlist 50 according to a first, preferred embodiment, which is described below with additional reference to FIGS. 6 and 8 to 11. A logic circuit 20 of an FPGA 22 itself is functionally illustrated for example in FIGS. 7 to 10. The logic circuit 20 constitutes a logic circuit that represents the FPGA 22 after a configuration.

Figure 5:
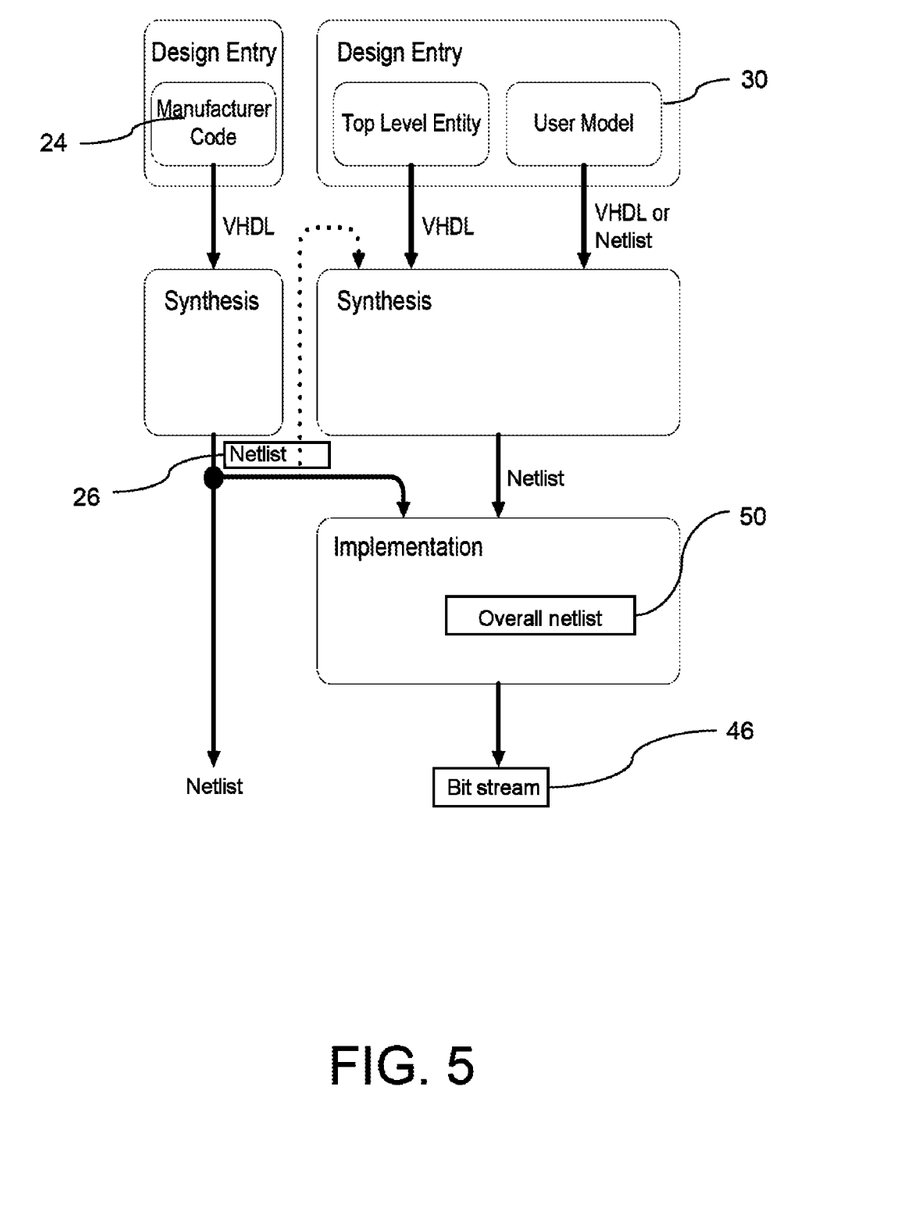
FIG. 5 shows a generalized and simplified flow diagram of the method of the first embodiment.

A first step S100 involves providing a first PLD code 24, which is an FPGA code in this exemplary embodiment for the FPGA 22, as a first netlist 26. The first netlist 26 is encrypted in this exemplary embodiment. The netlist can be present in a standardized format (EDIF). It is usually the result of a synthesis and is generated from a source code, as illustrated in FIG. 5. The netlist can additionally be placed and routed.

In this exemplary embodiment, the first PLD code 24 is a PLD code that is provided by a manufacturer of a system for use by a user. In this exemplary embodiment, this involves a system for real-time simulation of complex, dynamic models that are employed for example in automotive hardware-in-the-loop simulations (HIL) and in the field of automotive rapid control prototyping (RCP), where fast control loops have to be closed. Another example is controlled systems that have a high dynamic range and require low latencies.

Figure 10:
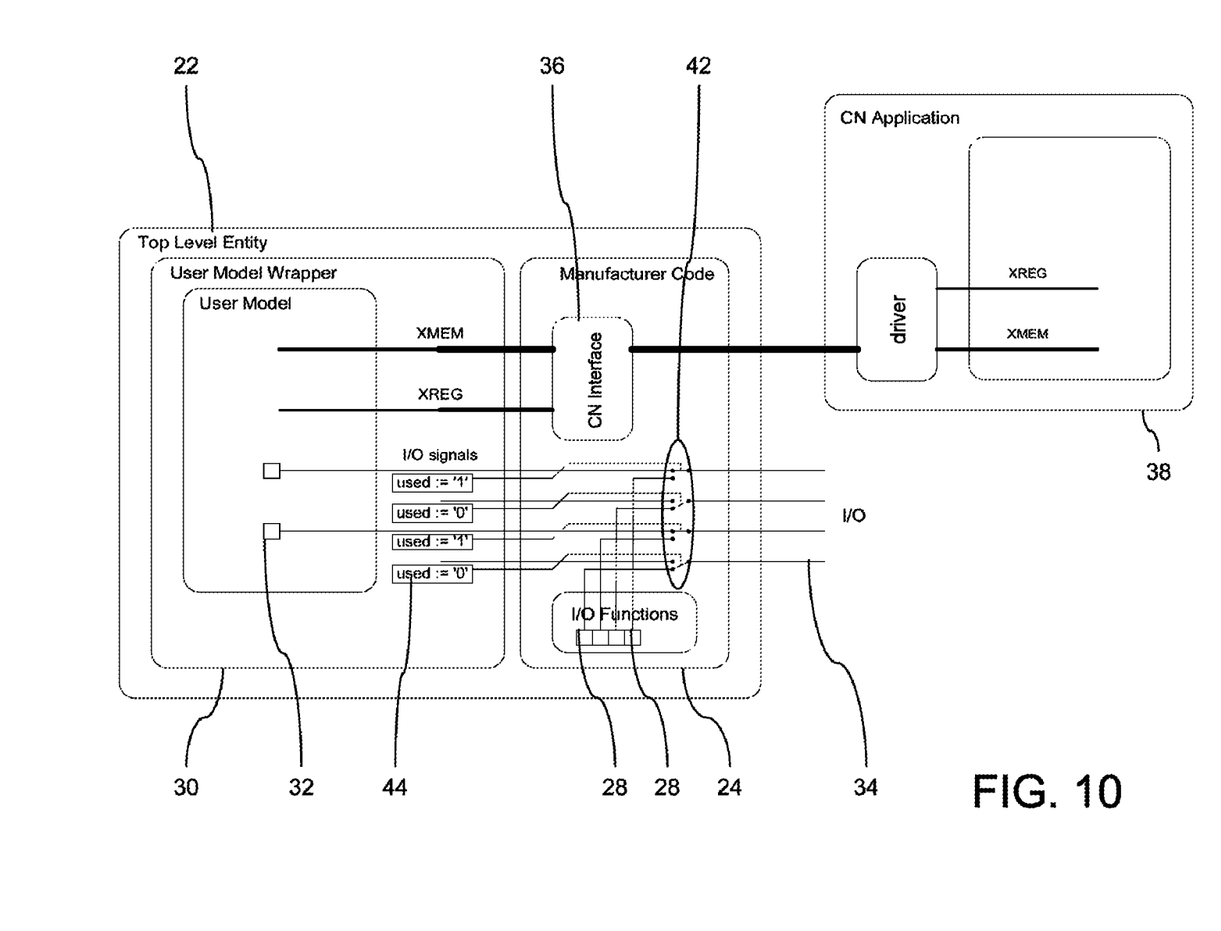
FIG. 10 shows an illustration of a computation node with FPGA and CPU for executing a mixture of manufacturer PLD code and user PLD code on the FPGA in accordance with the first and second embodiments.

The first PLD code 24 has a plurality of first functional blocks 28, which are illustrated for example in FIG. 10.

A step S110 involves providing a second PLD code 30. The second PLD code 30 has a plurality of second functional blocks 32 in each case for alternative use instead of a corresponding first functional block 28. The first and second functional blocks 28, 32, respectively are connected to the CN interface 36. The CN interface 36 constitutes the access to the FPGA 22 for transferring data between the FPGA 22 and a model part 38, which is executed on a CPU, of a computation node. The first functional blocks 28 here offer a standard functionality for the processing of signals provided via the I/O channels 34. The standard functionality of the first functional blocks 28 is replaced as necessary by the second functional blocks 32.

A step S120 involves providing a switch PLD code 40. The switch PLD code 40 comprises a plurality of switches 42. In this exemplary embodiment, the switch PLD code 40 is provided integrally with the first PLD code 24. If the first PLD code 24 is intended to be placed and routed already before combination with the second PLD code 30, it is advantageous to provide the switch PLD code 40 as autonomous code.

A step S130 involves connecting each switch 42 to a corresponding first functional block 28. In addition, step S130 also involves connecting the second functional blocks 32 to a respective switch 40. The second functional blocks 32 implemented thus constitute alternatives to the corresponding first functional block 28.

A step S140 involves connecting the switches 42 to the I/O channels 34 of the FPGA 22. In this exemplary embodiment, a switch 42 is assigned to each of the I/O channels 34. This is illustrated by way of example in FIG. 7. As can be discerned therein, the switches 42 are connected to different input and output signals 48 of the FPGA 22.

A step S150 involves presetting the switches 42 for connection to the first functional blocks 28.

A step S160 involves implementing switch driving signals 44 for the second functional blocks 32. In this exemplary embodiment the switch driving signals 44 are implemented in the second PLD code 30. The switch driving signals 44 bring about a setting of the corresponding switches 42 for connecting to the corresponding second functional block 32. In this exemplary embodiment, the switch driving signals 44 are implemented as constant signals, such that a permanent selection for the corresponding first or second functional block 28, 32 is made with the assignment of the switch driving signals 44 in the switch PLD code 40.

A step S170 involves creating the overall netlist 50 from the first PLD code 24, the second PLD code 30 and the switch PLD code 40. In this exemplary embodiment, the second PLD code 30 is individually synthesized to form a second netlist. The first netlist 26 and the second netlist of the corresponding first and second PLD codes 24, 30 are then incorporated under a top entity. The first netlist 26 and the second netlist are joined together in a further step.

Figure 8:
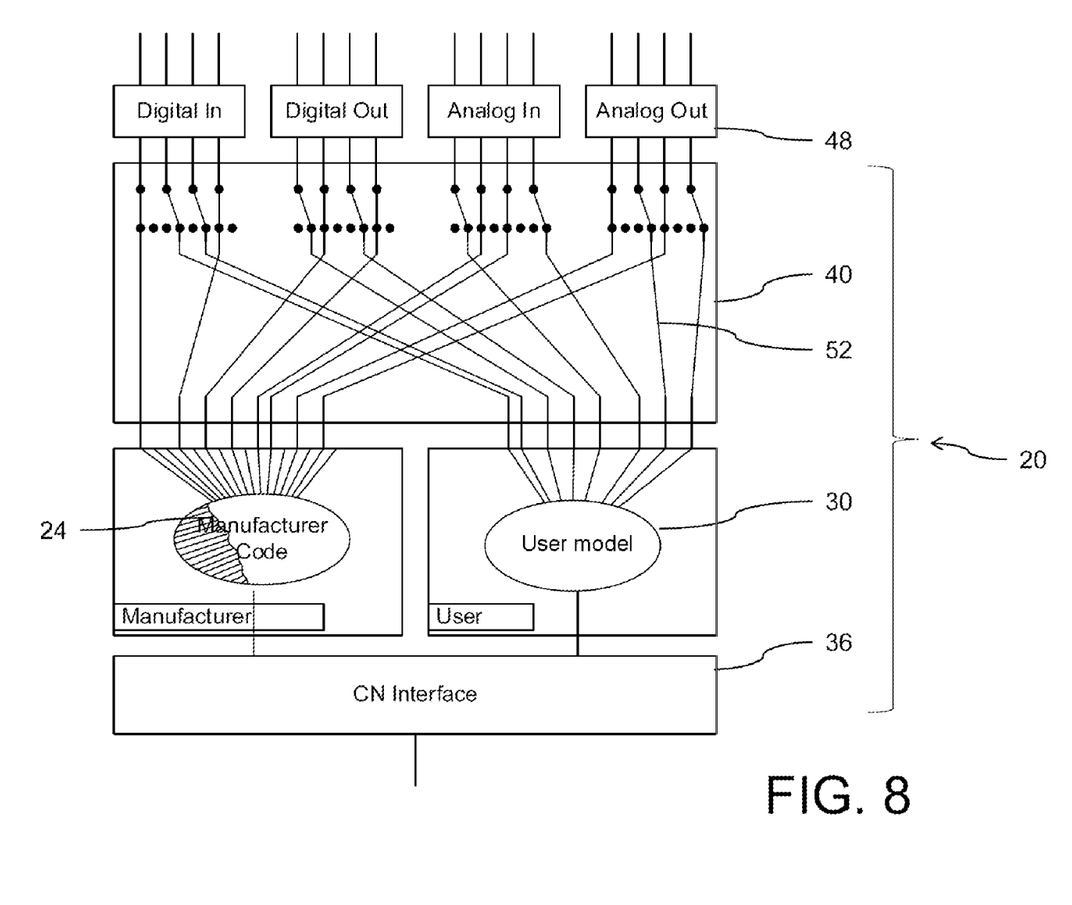
FIG. 8 shows the illustration of a logic circuit of an FPGA on the basis of FIG. 7, wherein unutilized signal paths for connecting switches to first and/or second functional blocks were removed in accordance with the methods according to the first and second embodiments.
Figure 9:
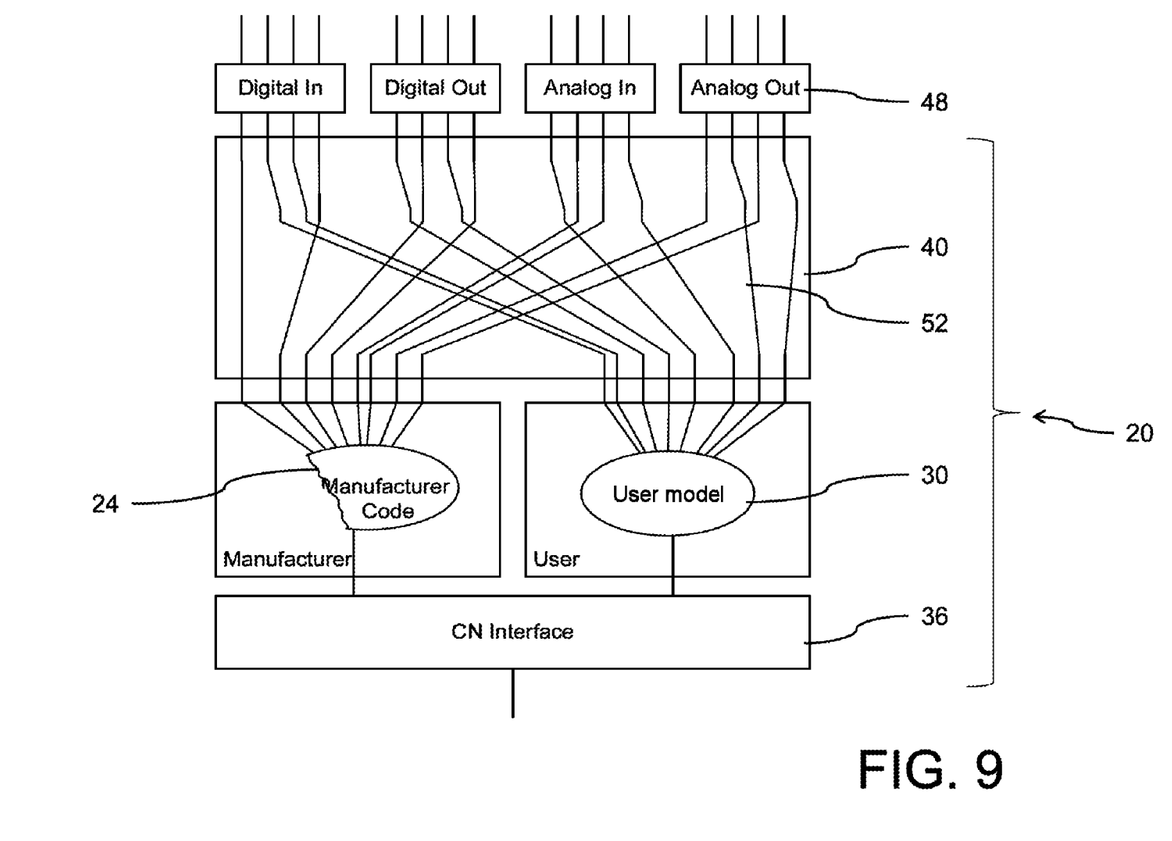
FIG. 9 shows the illustration of a logic circuit of an FPGA on the basis of FIG. 8, wherein additionally unutilized functional first blocks of the first PLD code and the switches of the switch PLD code were removed in accordance with the methods according to the first and second embodiments.

A step S180 involves removing from the overall netlist 50 functional first blocks 28 which are not utilized on the basis of the switch driving signal 44 of the corresponding switch 42. In this exemplary embodiment, this is likewise part of creating the overall netlist 50. Consequently, all unused first and second functional blocks 28, 32, usually first functional blocks 28, which are not utilized on the basis of the switch driving signal 44 of the corresponding switch 42 can be removed by optimization. This also includes the removal of the switches 42, as illustrated with reference to FIGS. 7 to 9. Accordingly, as shown in FIG. 8, signal paths 52 between the switches 42 and the first and second functional blocks 28, 32, respectively are removed. Furthermore, the switches 42 themselves are also removed, as illustrated in FIG. 9. Finally, it can be discerned in FIG. 9 that unutilized first functional blocks 28 of the first PLD code 24 were removed.

In this exemplary embodiment, when creating the overall netlist 50 it is automatically recognized that the switch 42 is set by a constant switch driving signal 44, such that in each case only the corresponding first or second functional block 28, 32 can be used.

In accordance with the method described with reference to FIG. 4, FIG. 5, which illustrates the method in a greatly simplified way, additionally reveals a connection of code components of the FPGA 22. As illustrated, a first netlist 26 is created from the first PLD code 24. The netlist 26 may be the result of the synthesis or may already have undergone the further steps of placing and routing. The first netlist 26 is created and provided by a manufacturer and can be used by a user. The user generates the second PLD code 30 as source code. The source code constitutes a description of a part of the functionality of the logic circuit 20 of the FPGA 22. In this exemplary embodiment, the source code is provided in text form in the VHDL format. In an alternative embodiment, the source code is provided in the Verilog format or other formats. In a further alternative embodiment, the source code is provided as graphical source code, also designated as graphical model, for example as a Simulink model, flow diagram, circuit diagram or the like.

Alternatively, the second PLD code 30 can be provided as a second netlist, for example if a source code has already been synthesized to form the second netlist beforehand and is now intended to be used again, for example with a modified first PLD code 24.

Joining together the first netlist with the second PLD code can be carried out during the synthesis or implementation. For this purpose, the first netlist and the second PLD code are instantiated in a top level entity.

Figure 6:
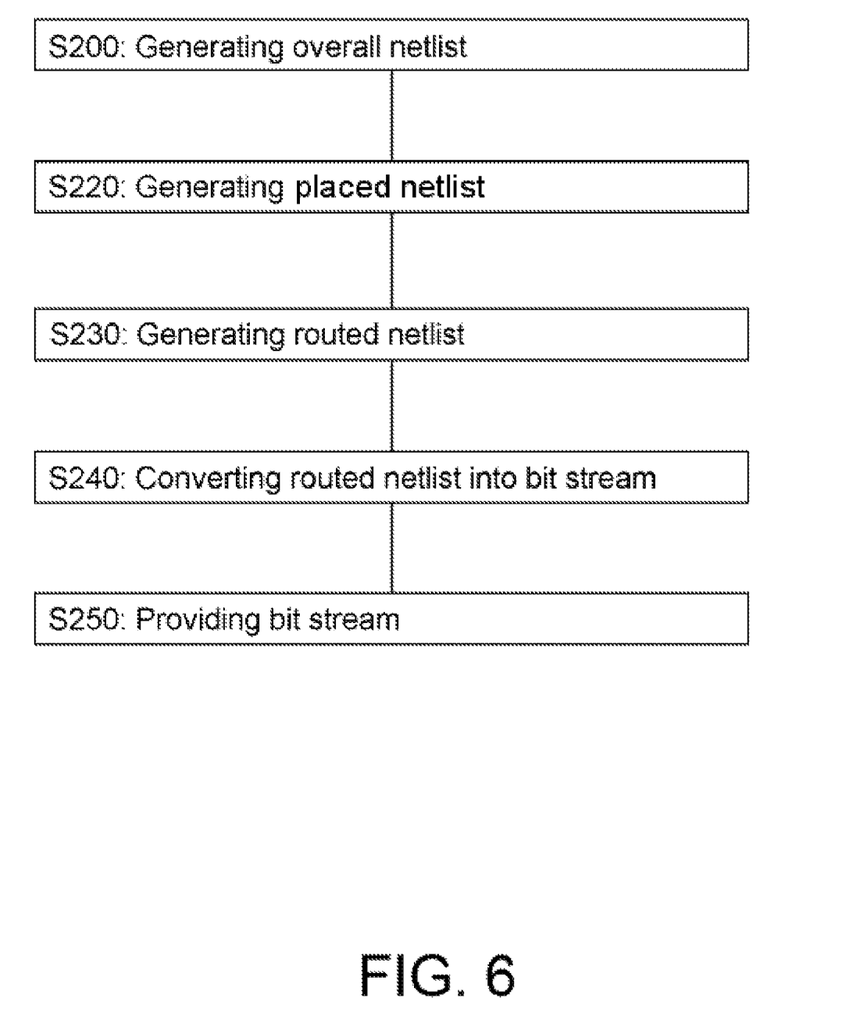
FIG. 6 shows a detailed flow diagram of the method for generating a bit stream from a PLD code according to a second embodiment.
Figure 7:
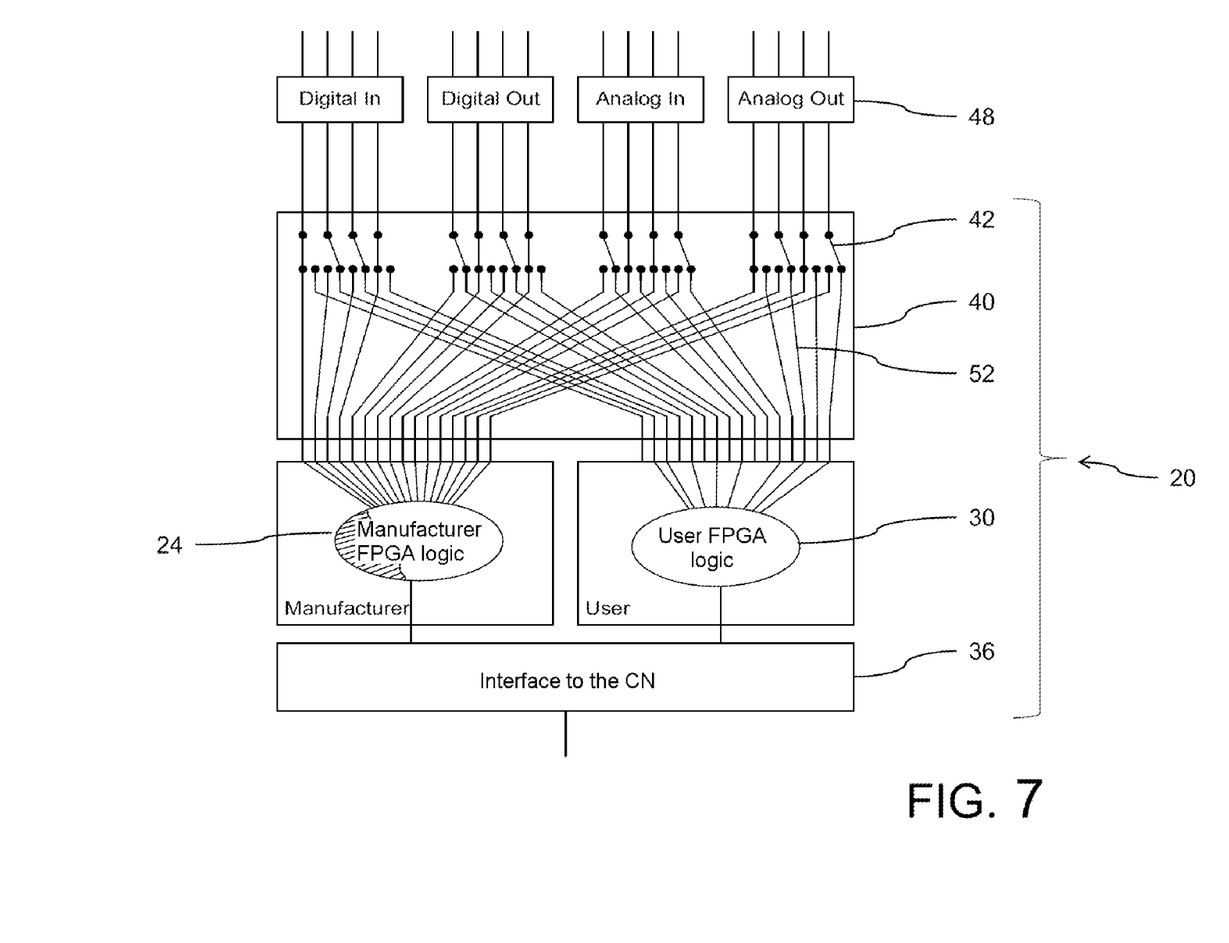
FIG. 7 shows an illustration of a logic circuit of an FPGA on the basis of a mixture of manufacturer PLD code and user PLD code in accordance with the methods according to the first and second embodiments.

Referring to FIG. 6, a description is given of a method for generating a bit stream 46 as continuation of the above method for generating an overall netlist 50 according to a second embodiment of the present invention.

Accordingly, the method begins with step S200, which comprises the method for creating an overall netlist 50 as described above with reference to steps S100 to S180.

A step S220 involves generating a placed netlist from the overall netlist 50 generated in step S200. This step is accordingly also designated as placing. In the placed netlist, specific logic elements of a target FPGA 22 are assigned to the logic elements.

A step S230 then involves generating a routed netlist from the placed netlist. The routed netlist is a result of the routing of the placed netlist and contains a definition of connecting lines between individual logic elements of the FPGA 22.

Step S240 then involves converting the routed netlist into a bit stream 46.

Step S250 involves providing the bit stream 46. The bit stream 46 can then be loaded onto the FPGA 22 as necessary.

LIST OF REFERENCE SIGNS

FPGA (prior art) 10
Interface (prior art) 12
Input and/or output signals (prior art) 14
First and/or second functional blocks (prior art) 16
Logic circuit of the FPGAs 20
FPGA 22
First PLD code 24
Netlist 26
First functional block 28
Second PLD code 30
Second functional block 32
I/O channel 34
Interface to the CN 36
Model part that is executed on a CPU 38
Switch PLD code 40
Switch 42
Switch driving signal 44
Bit stream 46
Input and/or output signal 48
Overall netlist 50
Signal path 52

What is claimed is:

1. A method for generating an overall netlist comprising the following steps:
   providing a first PLD code as first netlist, wherein the first PLD code has at least one first functional block,
   providing a second PLD code, wherein the second PLD code has at least one second functional block for alternative use instead of a corresponding first functional block,
   providing a switch PLD code having at least one switch assigned to the at least one first functional block for connecting the first functional block assigned to the switch,
   connecting the at least one second functional block to one switch from the at least one switch as an alternative to the corresponding first functional block,
   implementing at least one constant switch driving signal for the at least one second functional block, wherein the at least one switch driving signal is assigned to the corresponding switch for connecting the at least one second functional block,
   creating the overall netlist from the first PLD code, the second PLD code and the switch PLD code,
   removing from the overall netlist functional first blocks which are not utilized on the basis of the switch driving signal of the corresponding switch generating a placed netlist from the overall netlist, generating a routed netlist from the placed netlist, and converting the routed netlist into a bit stream.

2. The method of claim 1, wherein the method comprises the additional step of presetting the at least one switch in the switch PLD code for connecting the assigned first functional block.

3. The method of claim 1, wherein the step of providing a switch PLD code comprises providing the switch PLD code as part of the first PLD code or as a separate PLD code.

4. The method of claim 2, wherein the step of providing a switch PLD code comprises providing the switch PLD code as part of the first PLD code or as a separate PLD code.

5. The method of claim 1, wherein
the step of providing a first PLD code as first netlist comprises providing the first PLD code as a routed netlist, and
the step of providing a switch PLD code comprises providing the switch PLD code as a separate PLD code.

6. The method of claim 2, wherein
the step of providing a first PLD code as first netlist comprises providing the first PLD code as a routed netlist, and
the step of providing a switch PLD code comprises providing the switch PLD code as a separate PLD code.

7. The method of claim 5, wherein the first netlist leaves free a contiguous area of the FPGA resources for the second PLD code.

8. The method of claim 6, wherein the first netlist leaves free a contiguous area of the FPGA resources for the second PLD code.

9. The method of claim 1, wherein the step of implementing at least one switch driving signal for the at least one second functional block comprises implementing the at least one switch driving signal in the second PLD code.

10. The method of claim 1, wherein the method comprises the step of connecting I/O channels to the first and/or second functional block.

11. The method of claim 1, wherein the step of providing a first PLD code as first netlist comprises providing the first PLD code as an encrypted netlist.

12. The method of claim 1, wherein the step of providing a second PLD code comprises providing the second PLD code as source code.

13. The method of claim 12, wherein the step of providing a second PLD code as source code comprises providing the second PLD code in text form or as a graphical program.

14. The method of claim 1, wherein the step of providing a second PLD code comprises providing the second PLD code as a second netlist.

15. The method of claim 1, wherein the step of creating the overall netlist from the first PLD code, the second PLD code and the switch PLD code comprises creating a second netlist and a switch netlist and merging the first netlist, the second netlist and the switch netlist.

16. A programmable data processing device for carrying out the method of claim 1.

17. A computer program product comprising computer-implemented instructions which, after loading and execution in a suitable data processing device, performs the method of claim 1.

18. A digital storage medium comprising electronically readable control signals which can interact with a programmable data processing device such that the method of claim 1 is performed on the data processing device.

* * * * *